United States Patent
Kostenko et al.

(10) Patent No.: US 10,334,748 B1
(45) Date of Patent: Jun. 25, 2019

(54) TOP-MOUNT CABLE MANAGEMENT STRUCTURE(S) FOR AN ELECTRONICS RACK

(71) Applicant: INTERNATIONAL BUSINESS MACHINES CORPORATION, Armonk, NY (US)

(72) Inventors: William P. Kostenko, Poughkeepsie, NY (US); John G. Torok, Poughkeepsie, NY (US); Steven C. McIntosh, Kingston, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/903,085

(22) Filed: Feb. 23, 2018

(51) Int. Cl.
*H05K 7/00* (2006.01)
*H05K 7/14* (2006.01)
*H05K 7/02* (2006.01)
*H05K 7/18* (2006.01)

(52) U.S. Cl.
CPC ........... *H05K 7/1491* (2013.01); *H05K 7/026* (2013.01); *H05K 7/183* (2013.01)

(58) Field of Classification Search
None
See application file for complete search history.

(56) References Cited

U.S. PATENT DOCUMENTS

| | | | |
|---|---|---|---|
| 5,402,515 A | 3/1995 | Vidacovich et al. | |
| 5,640,482 A | 6/1997 | Barry et al. | |
| 6,011,221 A | 1/2000 | Lecinski et al. | |
| 6,147,928 A * | 11/2000 | Onizuka | H01F 17/06 367/23 |
| 6,223,909 B1 | 5/2001 | Mendoza | |
| 6,268,787 B1 * | 7/2001 | Onizuka | H01F 17/06 336/174 |
| 6,327,139 B1 * | 12/2001 | Champion | H02B 1/202 174/69 |
| 6,805,248 B2 * | 10/2004 | Champion | H05K 7/1491 211/26 |

(Continued)

FOREIGN PATENT DOCUMENTS

WO  WO 1999/025127 A1  5/1999

*Primary Examiner* — Courtney L Smith
*Assistant Examiner* — Rashen E Morrison
(74) *Attorney, Agent, or Firm* — Tihon Poltavets, Esq.; Kevin P. Radigan, Esq.; Heslin Rothenberg Farley & Mesiti P.C.

(57) ABSTRACT

Top-mount cable management structures are provided to mount to an upper surface of an electronics rack, over a cable pass-through in the upper surface. The cable management structure includes a base structure to mount to the upper surface of the rack, and reside over the cable pass-through. The base structure includes a sidewall with at least one cable opening to allow one or more cables which pass-through the cable pass-through to also pass-through the sidewall of the base structure. A cover structure is provided mounted to the base structure. The base and cover structures together define a substantially enclosed housing disposed over the cable pass-through when the cable management structure is operatively positioned over the upper surface of the electronics rack and the one or more cables pass-through the at least one cable opening in the sidewall of the base structure.

18 Claims, 11 Drawing Sheets

(56) References Cited

U.S. PATENT DOCUMENTS

| | | | |
|---|---|---|---|
| 7,097,047 B2 * | 8/2006 | Lee | H05K 7/1449 |
| | | | 211/26.2 |
| 7,532,482 B2 * | 5/2009 | Miller | H04Q 1/06 |
| | | | 361/752 |
| 7,562,779 B2 | 7/2009 | Bravo et al. | |
| 7,718,889 B2 | 5/2010 | Rasmussen | |
| 8,047,474 B2 | 11/2011 | Lesniak et al. | |
| 8,193,448 B2 | 6/2012 | Syed | |
| 8,243,470 B2 | 8/2012 | Jaze et al. | |
| 8,502,071 B2 | 8/2013 | Caveney et al. | |
| 9,185,824 B2 | 11/2015 | Nordin et al. | |
| 2003/0121689 A1 | 7/2003 | Rasmussen et al. | |
| 2006/0268533 A1 * | 11/2006 | Miller | H04Q 1/06 |
| | | | 361/797 |
| 2014/0369653 A1 * | 12/2014 | Leigh | G02B 6/4452 |
| | | | 385/92 |
| 2015/0114709 A1 | 4/2015 | Li et al. | |

\* cited by examiner

TOP-MOUNT CABLE MANAGEMENT STRUCTURE(S) FOR AN ELECTRONICS RACK

BACKGROUND

In many server applications, processors, along with their associated electronics (e.g., memory, disc drives, power supplies, etc.) are packaged in removable drawer or subsystem configurations stacked within an electronics rack or frame, including information technology (IT) equipment. In other cases, the electronics may be in fixed locations within the rack.

As is known, as circuit density of electronic devices continues to increase in order to achieve faster and faster processing speeds, there is corresponding demand for circuit devices to be packed more closely together, and for the circuits themselves to be operated at increasingly higher clock speeds. Each new generation of processors and associated electronics continues to offer increased speed and function. In most cases, this has been accomplished by a combination of increased power dissipation and increased packaging density. The net result has been increased circuit density at all levels of packaging, including at the electronics rack level. This increased packaging density continues to require enhancements to rack-level enclosure designs, and associated structures, as well as to enhanced cooling approaches within a data center.

SUMMARY

Certain shortcomings of the prior art are overcome and additional advantages are provided through the provision, in one or more aspects, of an apparatus which includes a top-mount cable management structure to reside over an upper surface of an electronics rack, over at least one cable pass-through in the upper surface of the electronics rack. The top-mount cable management structure includes a base structure including a sidewall, at least one cable opening in the sidewall of the base structure, and a cover structure mounted to the base structure. The base structure is configured to mount to the upper surface of the electronics rack, and reside over the at least one cable pass-through in the upper surface of the electronics rack, and the at least one cable opening in the sidewall of the base structure is configured to allow one or more cables which pass-through the at least one cable pass-through in the upper surface of the electronics rack to also pass-through the sidewall of the base structure. Together the base structure and the cover structure define a substantially enclosed housing disposed over the at least one cable pass-through in the upper surface of the electronics rack when the top-mount cable management structure is operatively positioned over the upper surface of the electronics rack and the one or more cables pass-through the at least one cable opening in the sidewall of the base structure.

In an additional aspect, an apparatus is provided herein which includes an electronics rack, and a top-mount cable management structure. The electronics rack includes an upper surface with at least one cable pass-through in the upper surface. The top-mount cable management structure resides over the upper surface of the electronics rack, including over the at least one cable pass-through in the upper surface of the electronics rack. The top-mount cable management structure includes a base structure having a sidewall, and at least one cable opening in the sidewall of the base structure. The base structure is mounted to the upper surface of the electronics rack, and resides over the at least one cable pass-through in the upper surface of the electronics rack. The at least one cable opening allows one or more cables which pass-through the at least one cable pass-through in the upper surface of the electronics rack to also pass-through the sidewall of the base structure. The top-mount cable management structure further includes a cover structure mounted to the base structure. The cover structure defines, at least in part, a flat upper surface of the top-mount cable management structure, and together the base structure and the cover structure define a substantially enclosed housing disposed over the at least one cable pass-through in the upper surface of the electronics rack.

In a further aspect, a method of facilitating overhead egress of cabling from an electronics rack is provided. The method includes providing a top-mount cable management structure to reside over an upper surface of the electronics rack, over at least one cable pass-through in the upper surface of the electronics rack. Providing the top-mount cable management structure includes providing a base structure to mount to the upper surface of the electronics rack, and reside over the at least one pass-through in the upper surface of the electronics rack. The base structure includes a sidewall. Further, providing the top-mount cable management structure includes providing at least one cable opening in the sidewall of the base structure to allow one or more cables which pass-through the at least one cable pass-through in the upper surface of the electronics rack to also pass-through the sidewall of the base structure. Additionally, providing the top-mount cable management structure includes providing a cover structure mounted to the base structure. The base structure and the cover structure together define a substantially enclosed housing disposed over the at least one cable pass-through in the upper surface of the electronics rack when the top-mount cable management structure is operatively positioned over the upper surface of the electronics rack, and the one or more cables pass-through the at least one cable opening in the sidewall of the base structure.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages and details thereof, are explained more fully below with reference to the non-limiting example(s) illustrated in the accompanying drawings. Descriptions of well-known materials, systems, devices, processing techniques, etc., are omitted so as not to unnecessarily obscure the invention in detail. It should be understood, however, that the detailed description and the specific example(s), while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure. Note that reference is made below to the drawings, where the same reference numbers used throughout different figures designate the same or similar components. Note further that numerous inventive aspects and features are disclosed herein, and unless inconsistent, each disclosed aspect or feature is combinable with any other disclosed aspect or feature as desired for a particular application of a top-mount cable management structure and/or method, in accordance with the present invention.

The terms "electronics rack" and "rack" are used interchangeably herein, and may include (for instance) any frame, housing, compartment, server system, etc., having one or more heat generating components of, for example, a computer system, electronic system, information technology (IT) system, etc. In one embodiment, an electronics rack may include one or more electronic systems or subsystems. An electronic system or subsystem of an electronics rack may be movable or fixed relative to the electronics rack, with the electronic drawers of a multi-drawer rack unit and blades of a blade center system being examples of systems or subsystems of an electronics rack. Further, a data center may be or include, a computer or information technology (IT) installation containing one or more electronics racks. As a specific example, a data center may be an enterprise data center, and include one or more rows of rack-mounted computing units, such as rack-mounted server units.

Figure 1:
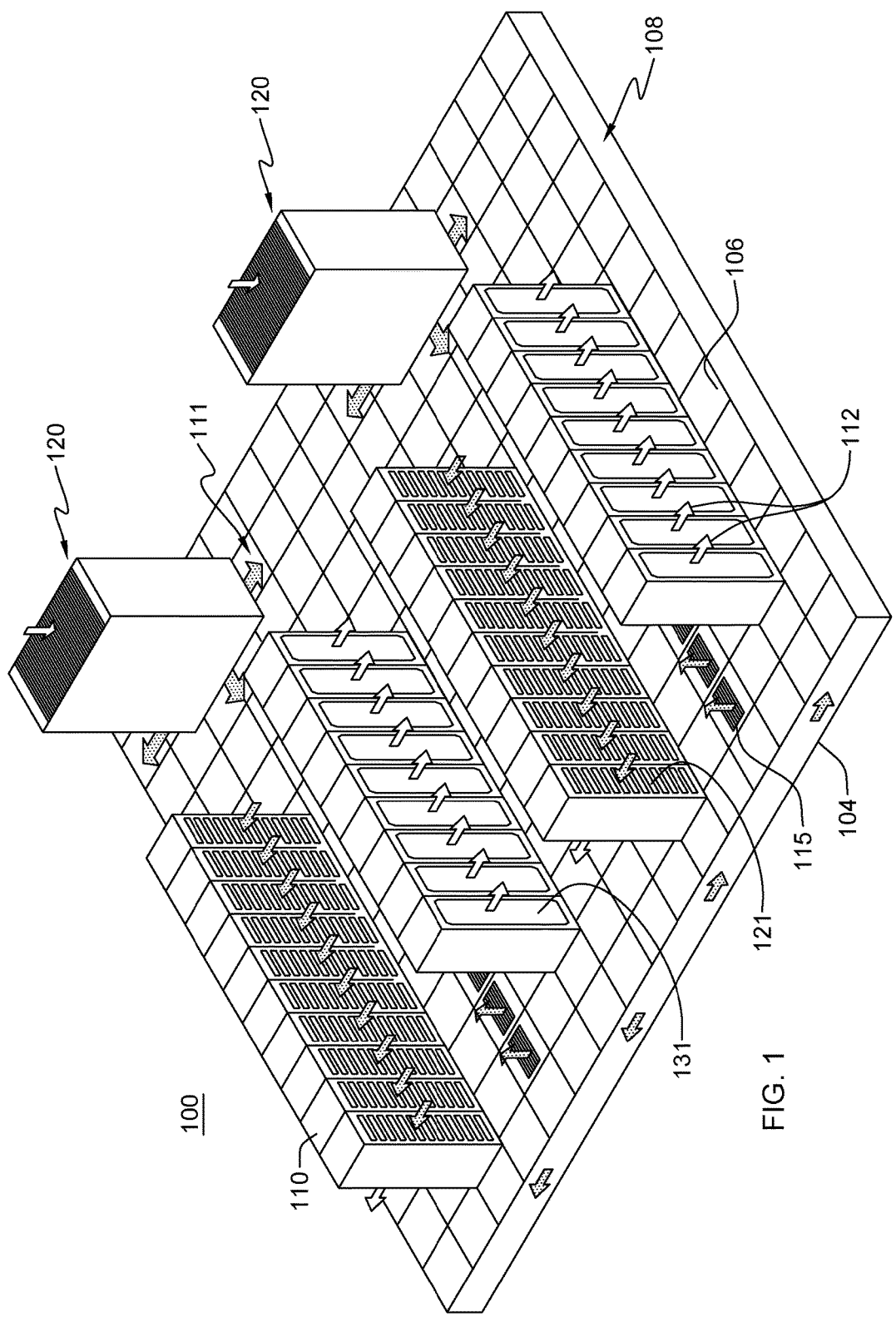
FIG. 1 depicts one embodiment of a data center within which one or more top-mount cable management structures may be used, in accordance with one or more aspects of the present invention.

FIG. 1 depicts one embodiment of a data center 100, which as one example, may be a raised floor layout of a computer installation. In the embodiment shown, data center 100 includes a plurality of electronics racks 110 disposed in rows on a raised floor 106. In operation, one or more computer room air-handling units (CRAHs) 120 (also referred to as computer room air-conditioners (CRACs)) draw in hot air, for example, through one or more air inlet vents in the top of the CRAHs, and exhaust cold air into a sub-floor plenum 108 below raised floor 106. By way of example, hot airflow within data center 100 is depicted by light arrows 112, and cold airflow is indicated by stippled arrows 111.

As shown in FIG. 1, electronics racks 110 may employ (in one example) a front-to-rear cooling approach. Namely, according to this approach, cold air 111 is drawn in through a front (or air-inlet side) 121 of each rack, and hot air 112 is exhausted from a rear (or air-outlet side) 131 of each rack. The cold air drawn into the front of a rack is supplied to air inlets of the electronic components (e.g., servers) disposed within the rack. Sub-floor plenum 108 may serve, in part, as a conduit to transport, for example, cold air 111 from air-handling unit(s) 120 to electronics racks 110. In one embodiment, electronics racks 110 may be arranged in a hot aisle/cold aisle configuration, with their air-inlet sides and air-outlet sides disposed in alternating directions, as illustrated in FIG. 1. Cold air 111 may be provided through one or more perforated floor tiles 115 in raised floor 106 from sub-floor plenum 108 into the cold aisles of data center 100. The cold air 111 may then be drawn into electronics racks 110, via their inlets, and subsequently exhausted into the hot aisles of the data center 100 as hot air via outlets of the individual electronics racks 110.

In one or more implementations, sub-floor plenum 108 below raised floor 106 may also accommodate conduit or cabling to and from the electronics racks of the data center 100 which may, in part, provide signals and/or power into and out of electronics racks 110, as well as interconnect between electronics racks 110 (in certain implementations).

Figure 2:
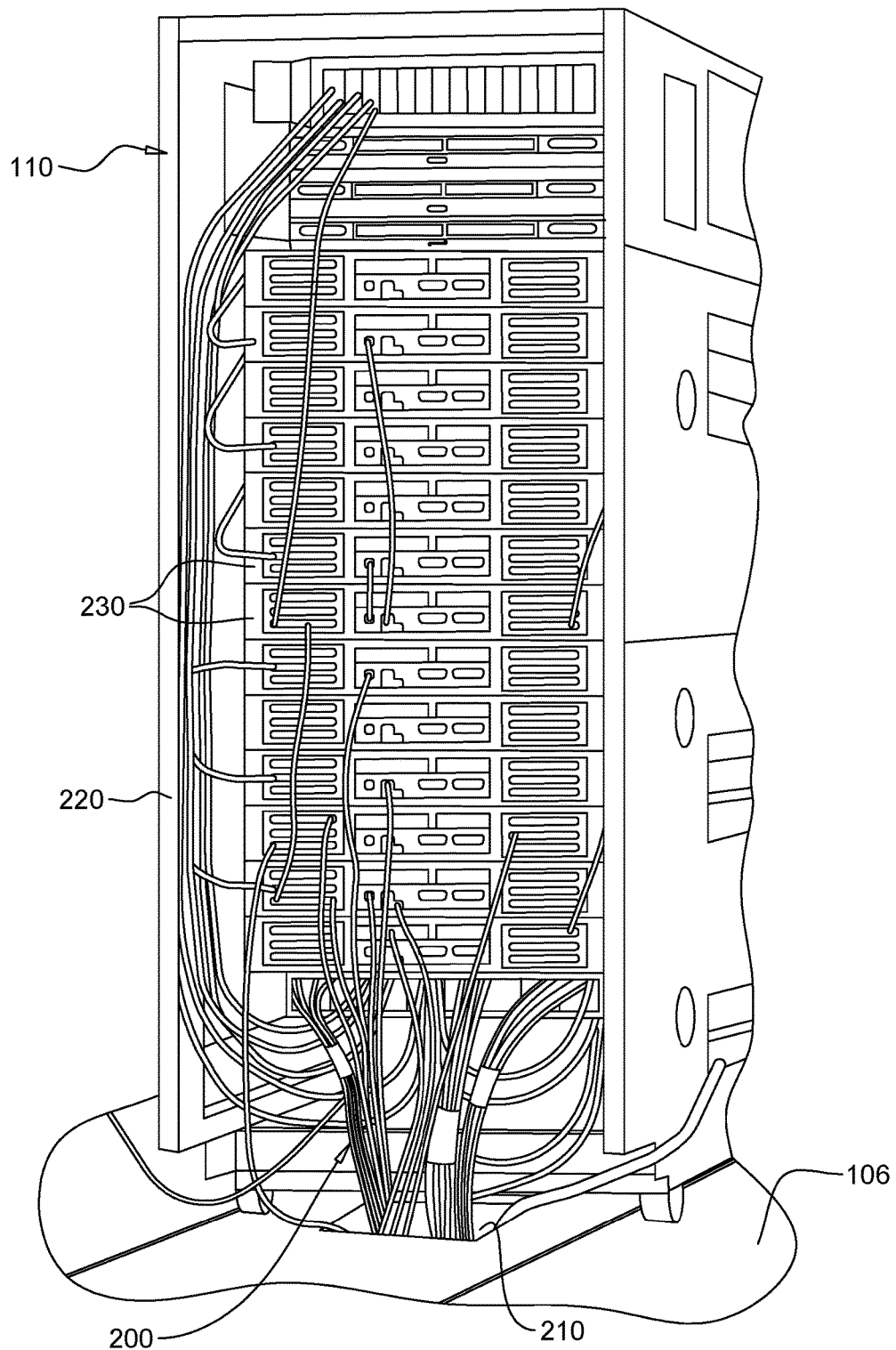
FIG. 2 depicts one embodiment of an electronics rack within a raised floor data center, with exiting cables from the rack passing through a floor tile into an under-floor plenum.

FIG. 2 illustrates further details of one embodiment of a raised floor 106 installation of an electronics rack 110, where at least some of the exiting cables 200, such as power cables, communications cables (e.g., ethernet cables, fiber, etc.), pass-through an opening 210 in raised floor 106 to the sub-floor plenum. As shown, electronics rack 110 includes a rack (or frame) 220 which supports a plurality of electronic subsystems 230 from and to which the exiting cables 200 extend, at least some of which pass-through opening 210 in raised floor 106 for coupling, for example, to one or more other electronics racks or other electronics equipment within the data center. In a conventional approach, cabling 200 may continue on beneath raised floor 106. Depending on the raised-floor implementation, however, this cabling may be sufficiently dense at the data center level as to impede airflow through the sub-floor plenum. Additionally, access to the underfloor cabling within the sub-floor plenum may be restricted and/or difficult in certain raised floor data center implementations.

Note that the raised floor data center environment of FIGS. 1 & 2 is presented by way of example only. In one or more other implementations, electronics racks may be disposed in a non-raised floor environment. In such a case, bottom-exiting cables from the electronics rack may be routed along the floor with, for instance, a protective covering over the cables to protect the cables, and reduce safety hazards within the non-raised floor data center.

Figure 3:
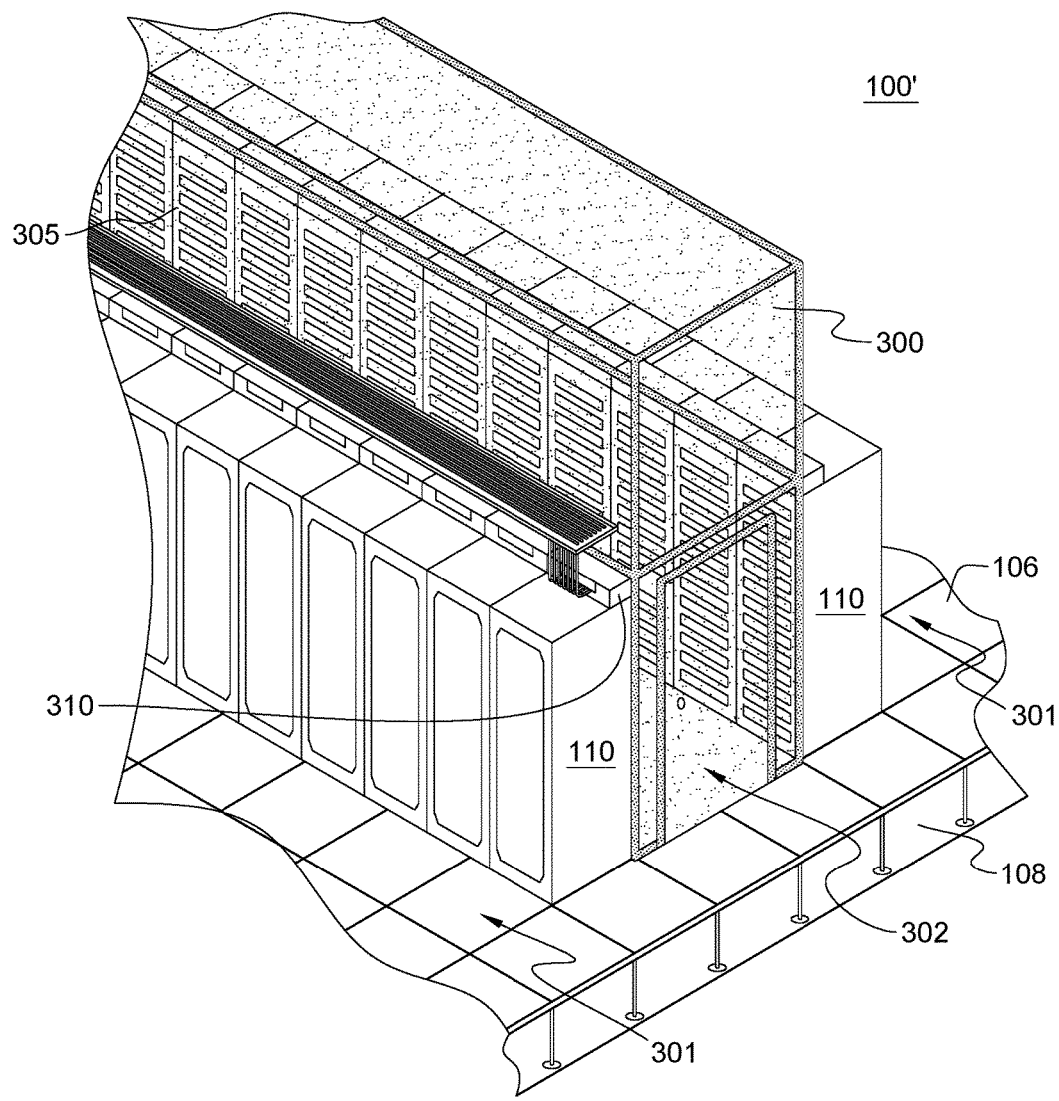
FIG. 3 depicts one embodiment of a data center with rows of electronics rack and top-mount cable management structures, along with an air flow containment system, in accordance with one or more aspects of the present invention.

FIG. 3 depicts an alternate data center approach, wherein cabling exits from the top of the electronics racks and passes overhead, above the electronics racks within a data center 100', which may be a raised floor data center or non-raised floor data center. In FIG. 3 data center 100' is shown (by way of example only) as a raised floor data center where a raised floor 106 facilitates defining sub-floor plenum 108 through which cold air is provided to cold air aisles 301, for instance, through appropriate perforated floor tiles (not shown) in raised floor 106. In this embodiment, data center 100' includes a hot air aisle containment system 300 which, for instance, seals hot air within hot air aisles 302 from mixing with cold air within cold air aisles 301, and facilitates directing the hot air back towards one or more computer room air handling units (not shown).

Note that variations on the data center embodiment of FIG. 3 might include implementing the data center in a non-raised floor environment, implementing a hot air aisle containment system only (as shown), implementing a cold air aisle containment system only, implementing both a hot air aisle and cold air aisle containment system and/or implementing an approach with a portion of the cabling exiting the electronics rack into the sub-floor plenum. Any of these data centers may utilize, at least in part, top-exiting cabling where, rather than completely extending downward through a raised floor into a sub-floor plenum, at least a portion of the exiting cables for the electronics racks extend overhead within the data center, for instance, on overhead cable raceways as shown in the example of FIG. 3.

In accordance with one or more aspects of the present invention, electronics racks 110 have associated therewith respective top-mount cable management structures 310, which facilitate managing egress or ingress of cables from or into electronics racks 110. As explained herein, the top-mount cable management structures (i.e., the cable exit hardware) disclosed provide a number of advantages to support a data center with top-exit cabling. For instance, the top-mount cable management structure(s) and methods disclosed facilitate establishing a rack-level, fire-rated enclosure in a top-exit cabling implementation notwithstanding presence of one or more cable pass-throughs in an upper surface of an electronics rack, as well as cushioning and/or managing of cabling that may egress towards either the front or rear of the rack, which in one or more implementations, may be accomplished via a common top-mount cable management structure. Additionally, as illustrated in FIG. 3, the top-mount cable management structure(s) disclosed facilitates enhanced integration with airflow containment systems, such as the hot air aisle containment system 300 of FIG. 3. Still further, traditional cable trunking hardware may be utilized in association with the top-mount cable management structures 310 disclosed herein, as desired for a particular application. By directing at least a portion of the exiting cabling from an electronics rack overhead, congestion in the subfloor plenum may be alleviated.

As illustrated in FIG. 3, in one or more implementations, the top-mount cable management structures 310 are partial top-hat structures that include a substantially flat upper surface and a width which substantially matches (in one or more embodiments) the width of the electronics racks to which the cable management structures are mounted. In this manner, a substantially continuous flat upper surface may be provided by adjacently disposed electronics racks with top-mount cable management structures as shown. This in turn facilitates supporting, and providing a substantially continuous surface for, airflow containment panels 305 of hot air aisle containment system 300.

Further, as explained below, in one or more embodiments, the top-mount cable management structure(s) 310 disclosed herein may be reversible to allow cabling to exit from the top of the electronics rack, through the top-mount cable management structure, in either a frontward or rearward direction as desired to accommodate, for instance, a desired airflow containment system within a data center. For example, when utilizing a cold air aisle containment system, it may be desirable to have cabling egress from the top-mount cable management structure towards the rear of the electronics rack. Note that this top exiting flexibility is provided while still addressing the need to establish or maintain a UL fire-rated electronics enclosure, and/or while still minimizing or preventing airflow recirculation within the data center through the top-mount cable management structure(s) disclosed.

As noted, packaging density of electronics racks continues to increase, which in part continues to stress an ability to manage and route internal and external signal and/or power cables (referred to generally herein as cables or cabling). In addition, recent and future data center trends reflect an increased desire to use top-exit cabling to overhead cable raceways. The top-mount cable management structures and methods disclosed herein advantageously provide an ability to support top-exit cabling without requiring additional floor space within the data center. In one or more embodiments, a reversible hardware structure is provided that mounts to the top surface of an electronics enclosure. Incorporated within the structure(s) are capabilities to manage and cushion the exiting cables, as well as support, for instance, cable trunking, that is, cable port connections, which allow signal and/or power cabling to connect directly to connectors provided in the top-mount cabling management structure itself. Further, the top-mount cable management structures disclosed provide, in one or more embodiments, a substantially enclosed housing which maintains or enables a fire-rated rack enclosure, notwithstanding the top-exiting cabling (e.g., addresses, at least in part, UL requirements for information technology equipment).

Figure 4:
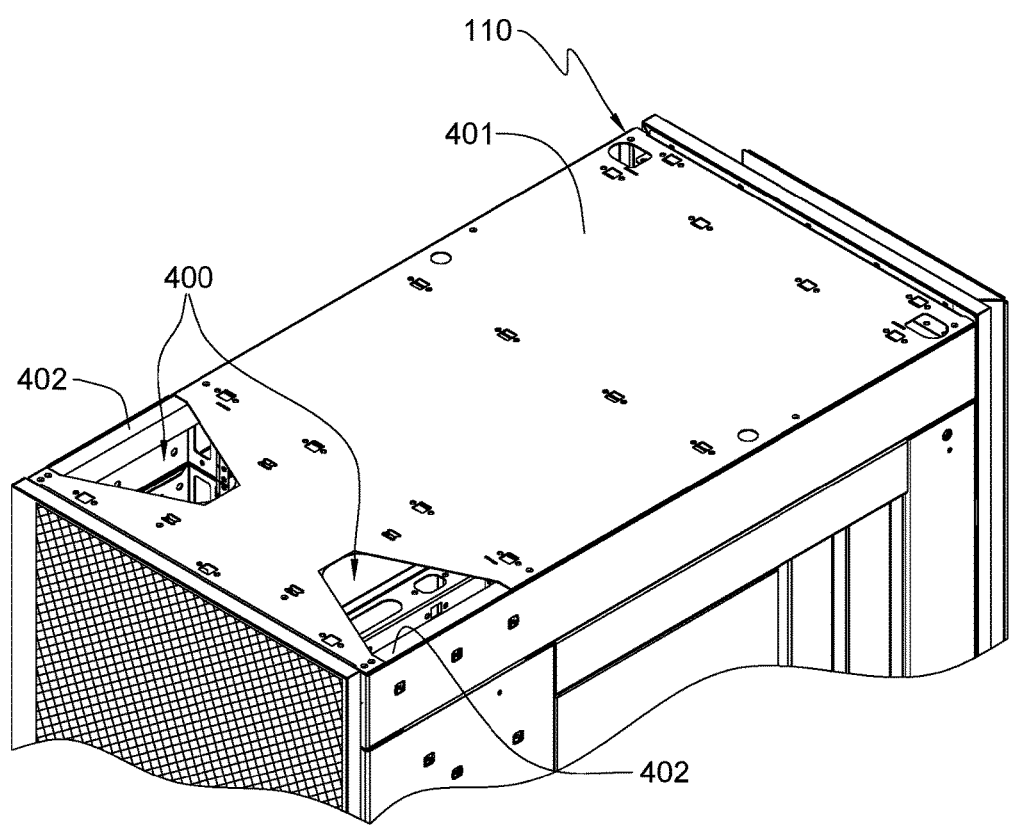
FIG. 4 is a partial depiction of an electronics rack with one or more cable pass-throughs in the upper surface of the electronics rack, over which a top-mount cable management structure may reside, in accordance with one or more aspects of the present invention.

By way of example, FIG. 4 depicts one detailed embodiment of an electronics rack 110 with one or more cable pass-throughs 400 in an upper surface 401 of electronics rack 110 to allow for egress or ingress of cabling from or into electronics rack 110 through upper surface 401. As shown, the one or more cable pass-throughs 400 may be provided with cushioning 402 at the periphery to prevent damage to cabling extending through the pass-through(s) 400. Although not shown, electronics rack 110 may further include slider plates over the pass-through(s) 400 to, for instance, cover any portion of the pass-through(s) 400 not required for exiting cabling.

By way of more detailed example, FIGS. 5A-5D depict one embodiment of a top-mount cable management structure 310, in accordance with one or more aspects of the present invention. Top-mount cable management structure 310 is shown, by way of example, front facing to allow front exiting cabling in FIGS. 5A-5C, and rear facing to allow rear exiting cabling in FIG. 5D.

Figure 5A:
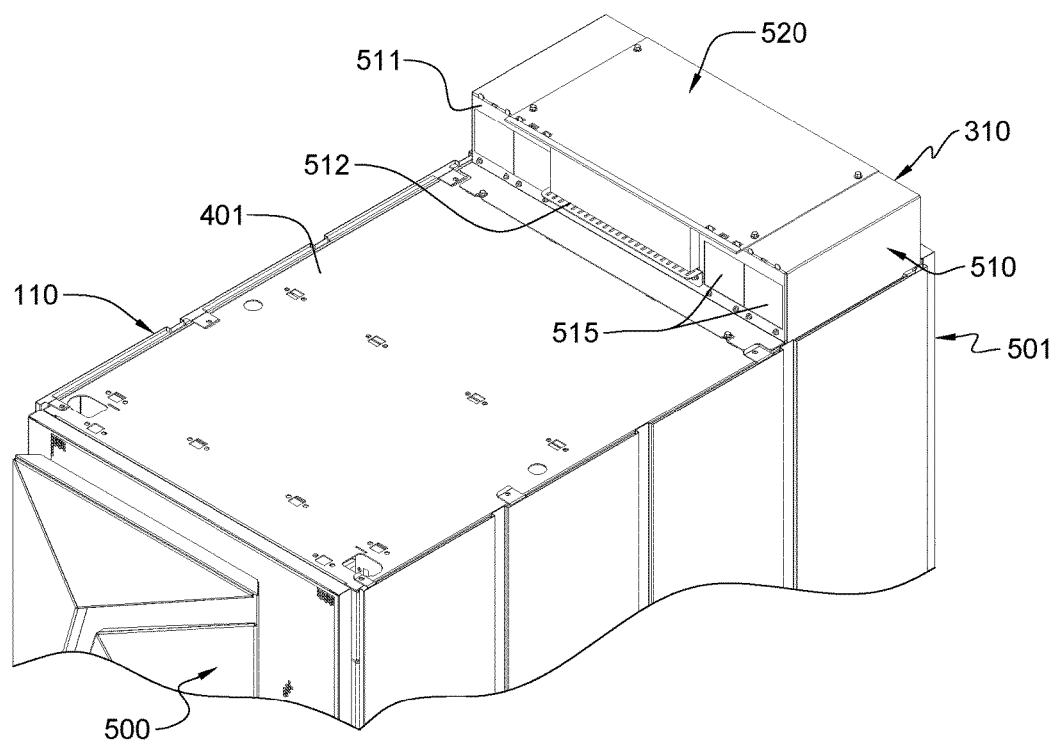
FIG. 5A depicts a partial front view of one embodiment of a top-mount cable management structure mounted to an electronics rack, in accordance with one or more aspects of the present invention.
Figure 5B:
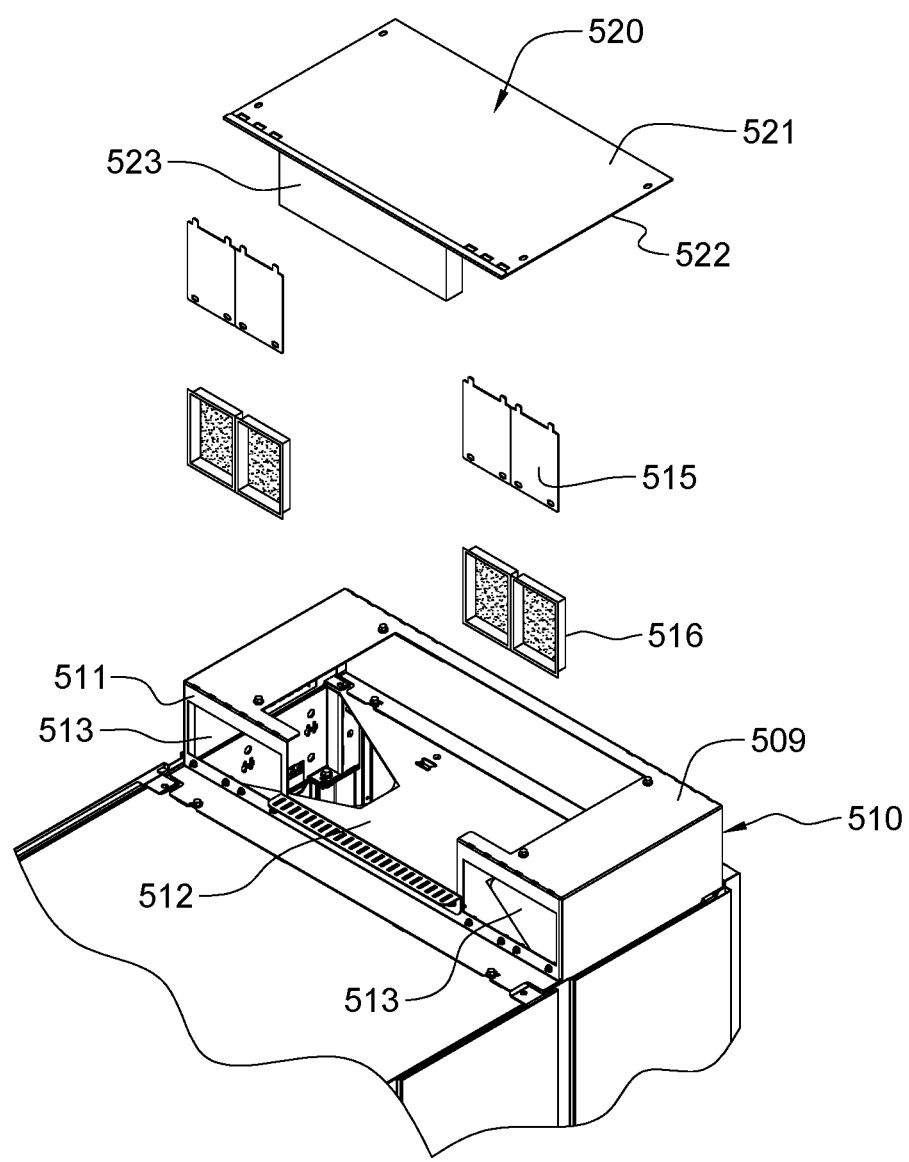
FIG. 5B is a partially exploded view of the top-mount cable management structure of FIG. 5A, in accordance with one or more aspects of the present invention.
Figure 5C:
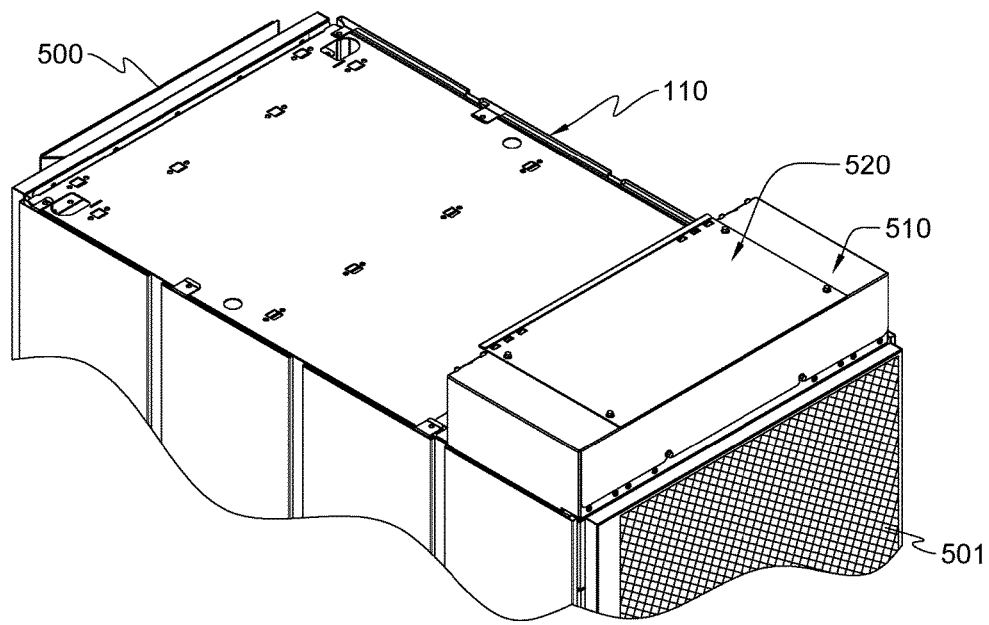
FIG. 5C is a partial rear view of the top-mount cable management structure and electronics rack of FIG. 5A, in accordance with one or more aspects of the present invention.

Referring collectively to FIGS. 5A-5C, top-mount cable management structure 310 is shown mounted to upper surface 401 of electronics rack 110, which has a front 500 (or air inlet side) and a rear 501 (or air outlet side). In one or more implementations, top-mount cable management structure 310 includes a substantially flat upper surface, defined, in part, (in one or more embodiments) by an upper surface 509 of a base structure 510 and an upper surface 521 of a cover plate 522 of a cover structure 520. Further, top-mount cable management structure 310 may have a width substantially equal to the width of electronics rack 110. Also, note that in one or more implementations, top-mount cable management structure 310 resides over only a portion of upper surface 401 of electronics rack 110 at the rear 501 of electronics rack 110, and may be sized and configured, in part, to mount to the upper surface relative to a vertically extending, rear Electronic Industry Association (EIA) support rail 530 (FIG. 5D) within electronics rack 110. For instance, the top-mount cable management structure may align behind rail 530 when mounted to the electronics rack. This positioning and sizing of top-mount cable management structure 310 may be desirable to, in part, inhibit air recirculation through the top-mount cable management structure. For instance, base structure 510 of top-mount cable management structure 310 may be configured and located relative to rail 530. In particular, in one or more embodiments, the leading edge of the top-mount cable management structure may align substantially over or fall slightly behind or ahead of rear EIA support rail 530 when the cable management structure is mounted to the rack upper surface.

In the embodiment depicted in FIGS. 5A-5C, base structure 510 of top-mount cable management structure 310 may be a substantially enclosed rigid structure with a sidewall 511 configured with one or more cable openings 512, and one or more trunk bracket openings 513. In one or more embodiments, the cable opening(s) 512 may be or include a central cable opening through which multiple cables may pass. For instance, cable opening(s) 512 may be sized to accommodate all top-exiting cables passing through the at least one cable pass-through 400 in the upper surface 401 of electronics rack 110. The trunk bracket openings 513 are provided to accommodate trunk brackets 516 to allow for connection of one or more external cables to electronics rack 110 without requiring routing of the cables at the data center into the electronics rack. That is, trunk brackets 516 facilitate respective cable port connections, each connecting at least one cable internal to the rack and top-mount cable management structure, to at least one external cable. Blank plates 515 may be provided, as shown in FIGS. 5A & 5B, to facilitate sealing trunk bracket openings 513 when not in use to prevent airflow through the openings.

As noted, in one or more embodiments, cover structure 520 includes a cover plate 522 within an upper surface 521. Additionally, a flexible element 523, such as an integral foam block, depends downward from cover plate 522. Flexible element 523 may be sized and positioned to extend into cable opening(s) 512 in sidewall 511 of base structure 510 when cover structure 520 is mounted (e.g., fastened) to base structure 510. Note that, in one or more implementations, base structure 510 and/or cover structure 520 are structurally rigid, being formed of a metal, or metal alloy. Note also, in one or more implementations, cable opening(s) 512 may be configured and sized to accommodate a specified number of cables top-exiting the electronics rack, and flexible element 523 may be sized to contact, and even compress against, the exiting cabling to facilitate sealing cable opening(s) 512 in operation, for instance, to prevent airflow recirculation through cable opening(s) 512.

Figure 5D:
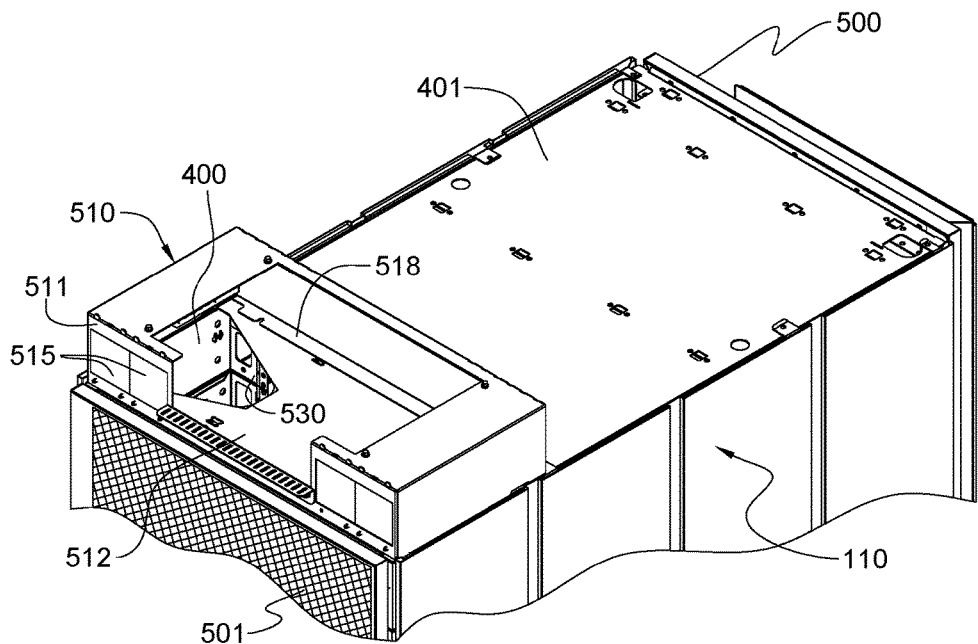
FIG. 5D is a rear view of the base structure of the top-mount cable management structure of FIGS. 5A-5C, with mounting of the base structure reversed, and the cover structure removed, in accordance with one or more aspects of the present invention.

As a variation, FIG. 5D depicts base structure 510 mounted to electronics rack 110 in reverse orientation so that exiting cabling from cable pass-through(s) 400 exit towards rear 501 of electronics rack 110. In this figure, the cover structure has been removed. Note that depending on the implementation, appropriate mounting structures, brackets, fasteners, etc. may be provided to allow, for instance, for affixing one or more internal flanges 518 of base structure 510 to electronics rack 110, such as to upper surface 401 of electronics rack 110. Also, as shown in FIG. 5D, cable management attachments 514 may be provided on or extending from one or more surfaces of sidewall 511 around the periphery of cable opening(s) 512 to, for instance, facilitate holding exiting cabling (not shown) in place, such as within the lower portion of cable opening(s) 512. As discussed above, in one or more embodiments, base structure 510 may be configured and sized to mount behind vertically extending, rear EIA support rail 530 within electronics rack, with the base structure, and in particular, one or more flanges 518 of base structure 510 mounted to upper surface 401 of electronics rack 110 in a location and manner which prevents or inhibits air from passing-through top-mount cable management structure 310 from or into electronics rack 110.

Figure 6A:
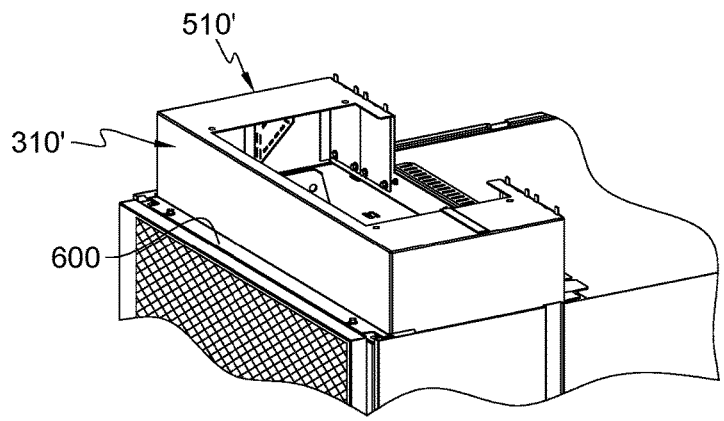
FIG. 6A depicts a partial rear view of an electronics rack with an alternate embodiment of a base structure of a top-mount cable management structure mounted thereto, with the base structure oriented for front exiting cabling, in accordance with one or more aspects of the present invention.
Figure 6B:
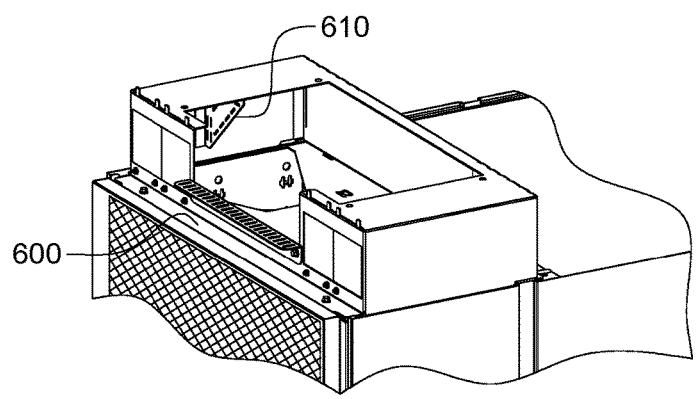
FIG. 6B depicts the base structure of FIG. 6A mounted reversed to the electronics rack to facilitate rear exiting cabling from the top-mount cable management structure, in accordance with one or more aspects of the present invention.
Figure 6C:
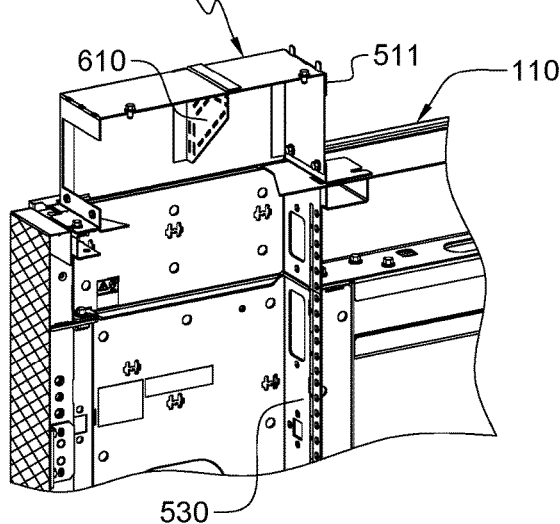
FIG. 6C is a partial cutaway view of the base structure and electronics rack of FIG. 6A, in accordance with one or more aspects of the present invention.

FIGS. 6A-6C depict an alternate embodiment of a base structure 510' for top-mount cable management structure 310 of FIGS. 5A-5D. In this configuration, base structure 510' includes external flange mounts 600 on the two long sides or edges of base structure 510'. As illustrated in FIGS. 6A & 6B, base structure 510' is also reversible and compatible with the cover structure, trunking plates and cable trunking hardware depicted in FIGS. 5A-5C, and described above. As illustrated in FIG. 6C, in one or more implementations, the leading sidewall 511 of base structure 510' may be disposed at, or aligned over a rear, vertically extending, EIA support rail 530, which as noted, may be a desired location or alignment to inhibit airflow, or airflow recirculation, through top-mount cable management structure 310'. Also, as shown in FIGS. 6A-6C, structural brackets 610 may be provided within any of the base structures discussed herein to facilitate strengthening the base structures to, for instance, support mounting of the cover structure to the base structure, as well as to provide support for any containment panels of a airflow containment system, such as discussed above.

Figure 7A:
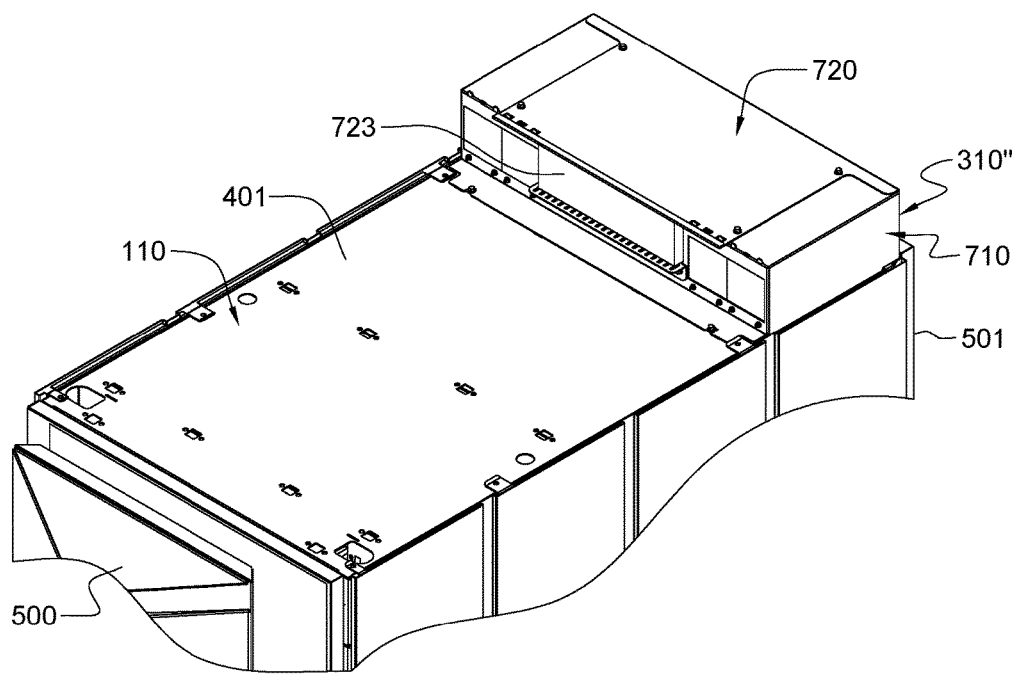
FIG. 7A depicts a partial front view of a further embodiment of an electronics rack with a top-mount cable management structure oriented for front exiting cabling, in accordance with one or more aspects of the present invention.
Figure 7B:
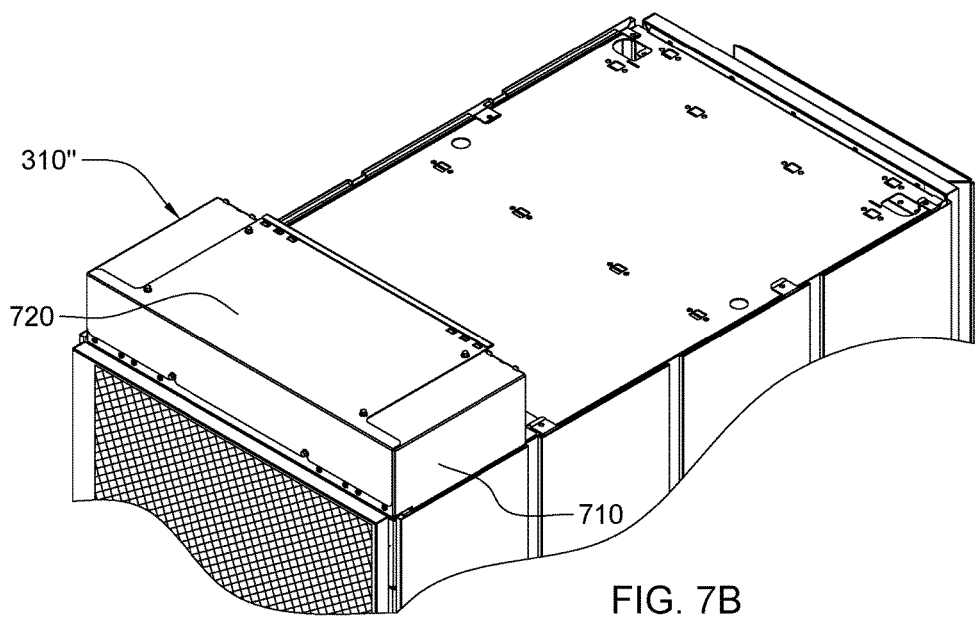
FIG. 7B depicts a partial rear view of the top-mount cable management structure and electronics rack of FIG. 7A, in accordance with one or more aspects of the present invention.
Figure 7C:
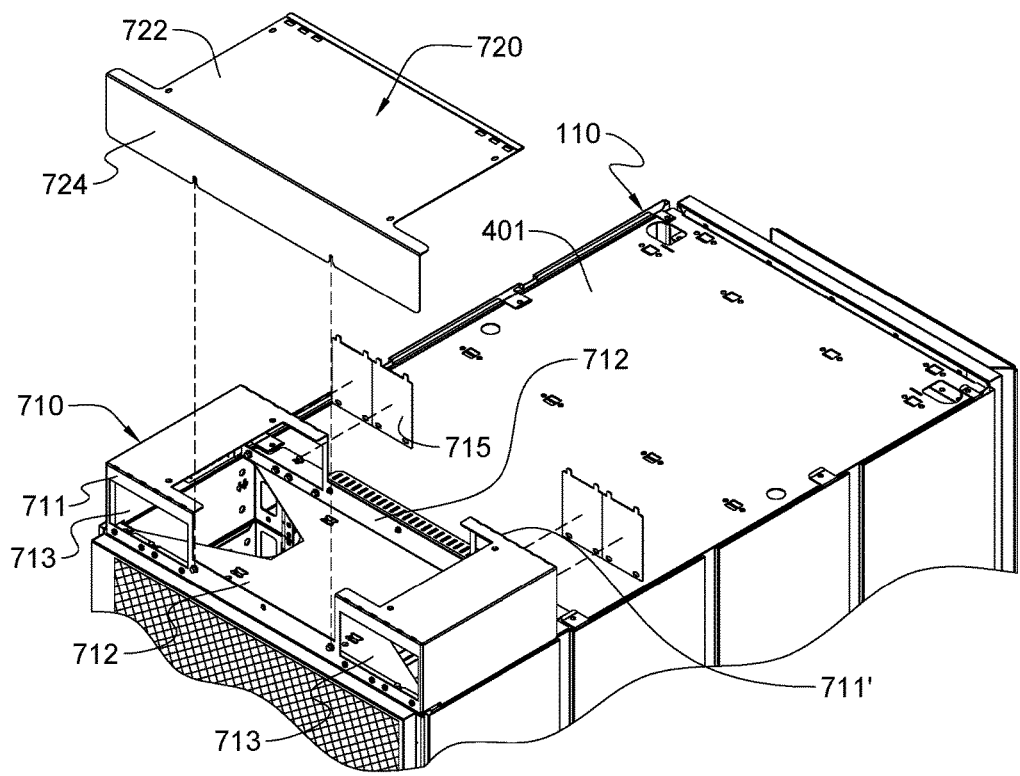
FIG. 7C is a partially exploded rear view of the top-mount cable management structure of FIGS. 7A & 7B, in accordance with one or more aspects of the present invention.

FIGS. 7A-7F depict a further detailed embodiment of a top-mount cable management structure 310", in accordance with one or more aspects of the present invention. Referring collectively to FIGS. 7A-7C, top-mount cable management structure 310" is shown oriented for top-exiting cabling to extend towards front 500 of electronics rack 110. FIG. 7A is a front view of top-mount cable management structure 310", FIG. 7B is a rear view of the structure mounted to electronics rack 110, and FIG. 7C is a rear view with the cover structure 720 and trunking plates shown exploded. As shown, in these figures, base structure 710 includes a first sidewall 711 and a second 711', which are opposite sidewalls of base structure 710, along the longer dimension of base structure 710, which as shown, may have a width substantially equal to the width of electronics rack 110. In one or more embodiments, sidewalls 711, 711' are similarly or identically configured with, a central cable opening 712, 712', and one or more trunk bracket openings 713 to facilitate cable trunking using, for instance, one or more cable port connectors (not shown), such as described above in connection with FIGS. 5A-5D. Blank plates 715 may be provided to seal trunk bracket openings 713 when one or more of the openings are not in use for a particular rack application.

Advantageously, in the embodiment depicted, cover structure 720 of top-mount cable management structure 310" is reversible when mounting to base structure 710. Depending from one edge of cover plate 722 is a sidewall cover plate 724, and from the other edge is a flexible element 723 sized and configured to depend into the respective cable opening(s) 712 in first sidewall 711, or second sidewall 711' of base structure 710 depending on how cover structure 710 is mounted to base structure 720, that is, depending on the desired direction of cable egress. As with the embodiments described above, the exit cabling where passing through the cable opening(s) 712 in the sidewall 711, 711' of base structure 710 is substantially parallel to upper surface 401 of electronics rack 110. As with the embodiments described above, flexible element 723 contacts, and may compresses against, the exit cabling passing through cable opening(s) 712 in sidewall 711, 711' of base structure 710, to facilitate blocking airflow through any unused portion of the cable opening(s) 712. Note that irrespective of the cover structure orientation in mounting to the base (i.e., front facing or rear facing) sidewall cover plate 724 is configured to cover all openings in the other sidewall of the base structure as to prevent airflow through that other sidewall.

Figure 7D:
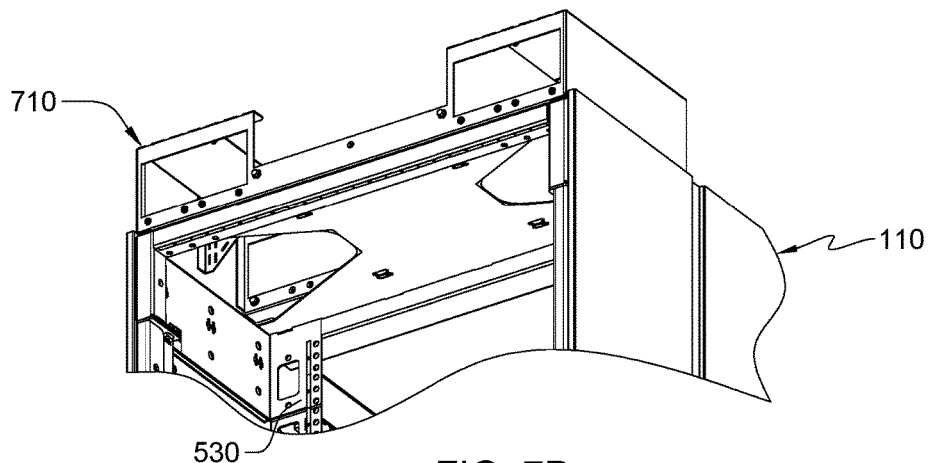
FIG. 7D is a partial cutaway view of electronics rack and base structure of the top-mount cable management structure of FIG. 7A-7C, in accordance with one or more aspects of the present invention.

FIG. 7D depicts base structure 710 being sized and located such that the leading face of base structure 710 aligns over or behind vertically extending, rear EIA support rail 530 within electronics rack 110, with the mounting flange 718 extending forward over the upper surface of the rack, above the EIA support rail 530. As noted, such a configuration of the base structure may be provided to ensure that airflow within the electronics rack is less likely to circulate through the top-mount cable management structure. This also advantageously facilitates integration of the top-mount cable management structure 310" and electronics rack 110 assembly with either a cold air aisle or hot air aisle containment system (such as depicted in FIG. 3), by providing the desired structural support through the cable management structure.

Figure 7E:
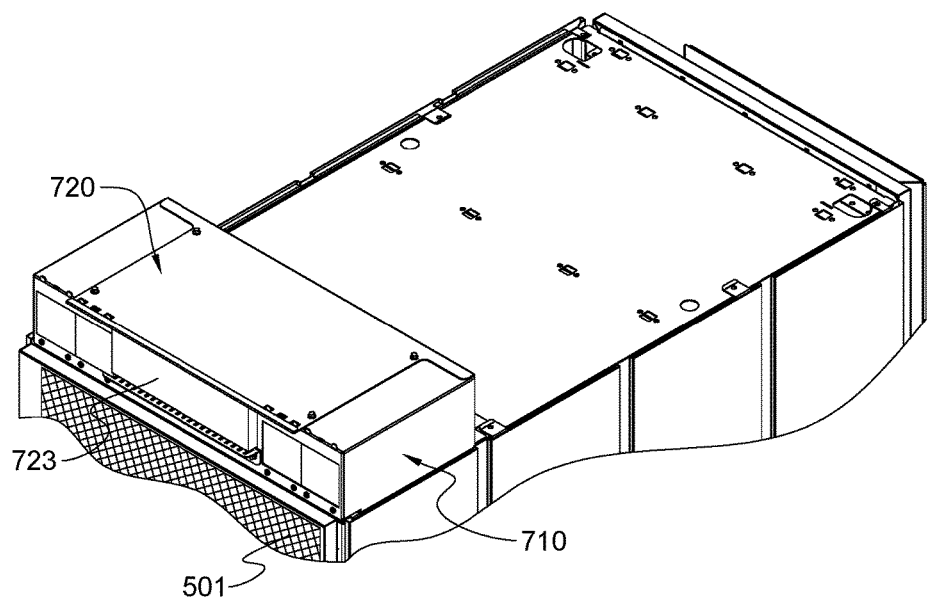
FIG. 7E is a partial rear view of the top-mount cable management structure of FIGS. 7A-7D rotated 180° to allow for rear exiting cabling, in accordance with one or more aspects of the present invention.
Figure 7F:
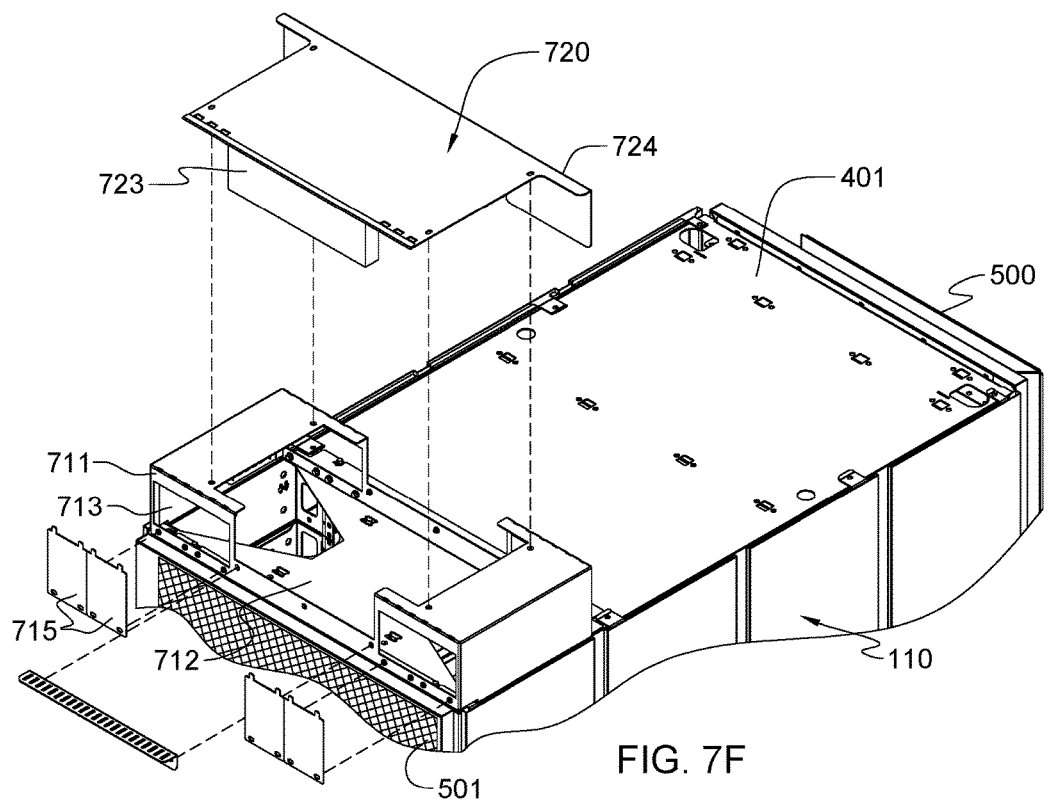
FIG. 7F is a partially exploded view of the top-mount cable management structure of FIG. 7E, in accordance with one or more aspects of the present invention.

By way of further example, FIGS. 7E & 7F depict top-mount cable management structure 310" of FIGS. 7A-7D with cover structure 720 reversed such that the cables exit towards the rear of electronics rack 110.

To summarize, those skilled in the art will note from the description provided above that an apparatus is disclosed herein that includes a top-mount cable management structure (or partial top-hat structure) to reside over an upper surface of an electronics rack, over at least one cable pass-through in the upper surface of the electronics rack. The top-mount cable management structure includes a base structure to mount to the upper surface of the electronics rack, and reside over the at least one cable pass-through in the upper surface of the electronics rack. The base structure includes a sidewall, and the cable management structure includes at least one cable opening in the side wall of the base structure to allow one or more cables which pass-through the at least one cable pass-through in the upper surface of the electronics rack to also pass-through the sidewall of the base structure. A cover structure is provided mounted to the base structure. The base structure and the cover structure together define a substantially enclosed housing disposed over the at least one cable pass-through in the upper surface of the electronics rack when the top-mount cable management structure is operatively positioned over the upper surface of the electronics rack, and the one or more cables pass-through the at least one cable opening in the sidewall of the base structure.

In one or more implementations, the electronics rack has an air inlet side and an air outlet side, and the top-mount cable management structure is configured to reside adjacent to the air outlet side of the electronics rack, over a portion of the upper surface of the electronics rack substantially aligned behind a vertically extending, rear Electronic Industry Association (EIA) support rail within the electronics rack. Further, in one or more implementations, the base structure of the top-mount cable management structure may have a width corresponding to a width of the electronics rack, and the cover structure may define, at least in part, a substantially flat upper surface of the top-mount cable management structure. The enclosed housing defined by the base structure and the cover structure facilitates achieving a UL-fire rated electronics enclosure notwithstanding the at least one cable pass-through in the upper surface of the electronics rack.

In one or more embodiments, the top-mount cable management structure may be reversible to allow the at least one cable opening in the sidewall of the base structure to face towards a front, air inlet side of the electronics rack or a rear, air outlet side of the electronics rack when the top-mount cable management structure is operatively positioned over the upper surface of the electronics rack. Further, the one or more cables may pass through the at least one cable opening in the sidewall of the base structure substantially parallel to the upper surface of the electronics rack. In one or more embodiments, the base structure may be configured to be reversible in mounting to the upper surface of the electronics rack to allow reversing of a direction of the one or more cables exiting through the at least one cable opening in the sidewall of the base structure, and thus, through the base structure of the top-mount cable management structure.

In one or more embodiments, the sidewall of the base structure is a first sidewall and the at least one cable opening is at least one first cable opening, and the base structure further includes a second sidewall, where the first sidewall and the second sidewall are opposite sidewalls of the base structure. Further, in this embodiment the top-mount cable management structure may include at least one second cable opening in the second sidewall of the base structure. The cover structure includes a sidewall cover plate extending downward from a cover plate of the cover structure, and the cover structure is reversible in mounting to the base structure. When mounted to the base structure, the sidewall cover plate covers one of the at least one cable opening in the first sidewall in the base structure or the at least one cable opening in the second cable opening in the second sidewall of the base structure, thereby providing the reversibility of the top-mount cable management structure. In one or more embodiments, the at least one first cable opening in the first sidewall of the base structure and the at least one second cable opening in the second sidewall of the base structure may be similarly sized and configured.

In one or more implementations, the cover structure may further include a flexible element disposed to extend down to the at least one cable opening in the sidewall of the base structure to facilitate defining the substantially enclosed housing by blocking, at least in part, airflow through the at least one cable opening in the sidewall of the base structure. In one or more embodiments, the at least one cable opening in the sidewall of the base structure may be sized to accommodate pass-through of multiple cables which extend through the at least one cable pass-through in the upper surface of the electronics rack, and the flexible element may be configured to reside within the at least one cable opening and contact, at least in part, the multiple cables. The multiple cables passing through the at least one cable opening in this implementation may be below the flexible element of the cover structure.

In one or more embodiments, the sidewall of the base structure may further include one or more cable port connectors that facilitate connection of one or more external cables to one or more respective internal cables within the electronics rack which pass-through the at least one cable pass-through in the upper surface of the electronics rack and connect internally to the one or more cable port connectors within the top-mount cable management structure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. An apparatus comprising:
    a top-mount cable management structure to reside over an upper surface of an electronics rack, over at least one cable pass-through in the upper surface of the electronics rack, the top-mount cable management structure comprising:
        a base structure to mount to the upper surface of the electronics rack, and reside over the at least one cable pass-through in the upper surface of the electronics rack, the base structure including a sidewall;
        at least one cable opening in the sidewall of the base structure to allow one or more cables which pass-through the at least one cable pass-through in the upper surface of the electronics rack to also pass-through the sidewall of the base structure;
        a cover structure mounted to the base structure, the base structure and the cover structure together defining a substantially enclosed housing disposed over the at least one cable pass-through in the upper surface of the electronics rack when the top-mount cable management structure is operatively positioned over the upper surface of the electronics rack and the one or more cables pass-through the at least one cable opening in the sidewall of the base structure; and
    wherein:
        the cover structure comprises a flexible element disposed to extend down to the at least one cable opening in the sidewall of the base structure to facilitate defining the substantially enclosed housing by blocking, at least in part, airflow through the at least one cable opening in the sidewall of the base structure; and
        the at least one cable opening in the sidewall of the base structure is sized to accommodate pass-through of multiple cables which extend through the at least one cable pass-through in the upper surface of the electronics rack, and wherein the flexible element is configured to reside within the at least one cable opening to contact and compress against, at least in part, the multiple cables.

2. The apparatus of claim 1, wherein the electronics rack has an air inlet side and an air outlet side, and wherein the top-mount cable management structure is configured to reside over the upper surface of the electronics rack at the air outlet side, and aligned in back of a vertically extending, rear Electronic Industry Association (EIA) support rail within the electronics rack.

3. The apparatus of claim 1, wherein the base structure of the top-mount cable management structure has a width corresponding to a width of the electronics rack, and the cover structure defines, at least in part, a substantially flat upper surface of the top-mount cable management structure, and wherein the enclosed housing defined by the base structure and cover structure facilitates achieving a UL-fire rated electronics enclosure notwithstanding the at least one cable pass-through in the upper surface of the electronics rack.

4. The apparatus of claim 1, wherein the top-mount cable management structure is reversible to allow the at least one cable opening in the sidewall of the base structure to face towards a front, air inlet side of the electronics rack or a rear, air outlet side of the electronics rack when the top-mount cable management structure is operatively positioned over the upper surface of the electronics rack, and wherein the one or more cables pass-through the at least one cable opening in the sidewall of the base structure substantially parallel to the upper surface of the electronics rack.

5. The apparatus of claim 4, wherein the base structure is configured to be reversible in mounting to the upper surface of the electronics rack to allow reversing of a direction of the one or more cables exiting through the at least one cable opening in the sidewall of the base structure, and thus, through the top-mount cable management structure.

6. The apparatus of claim 4, wherein the sidewall of the base structure is a first sidewall and the at least one cable opening is at least one first cable opening, and wherein the base structure further comprises a second sidewall, the first sidewall and the second side wall being opposite sidewalls of the base structure, and wherein the top-mount cable management structure further comprises at least one second cable opening in the second sidewall of the base structure, the cover structure including a sidewall cover plate extending downward from a cover plate of the cover structure, the cover structure being reversible in mounting to the base structure, and when mounted to the base structure, the sidewall cover plate covers one of the at least one first cable opening in the first sidewall of the base structure or the at least one second cable opening in the second sidewall of the base structure, thereby providing the reversibility of the top-mount cable management structure.

7. The apparatus of claim 6, wherein the at least one first cable opening in the first sidewall of the base structure and the at least one second cable opening in the second sidewall of the base structure are similarly sized and configured.

8. The apparatus of claim 1, wherein the multiple cables pass through the at least one cable opening below the flexible element of the cover structure extending into the at least one cable opening.

9. The apparatus of claim 1, wherein the sidewall of the base structure further comprises one or more cable port connectors that facilitate connection of one or more external cables to one or more respective internal cables within the electronics rack which pass-through the at least one cable pass-through in the upper surface of the electronics rack to connect internally to the one or more cable port connectors within the top-mount cable management structure.

10. An apparatus comprising:
   an electronics rack, the electronics rack comprising an upper surface with at least one cable pass-through in the upper surface; and
   a top-mount cable management structure residing over a portion of the upper surface of the electronics rack, including over the at least one cable pass-through in the upper surface of the electronics rack, the top-mount cable management structure comprising:
      a base structure mounted to the upper surface of the electronics rack, and residing over the at least one cable pass-through in the upper surface of the electronics rack, the base structure including a sidewall;
      at least one cable opening in the sidewall of the base structure to allow one or more cables which pass-through the at least one cable pass-through in the upper surface of the electronics rack to also pass-through the sidewall of the base structure;
      a cover structure mounted to the base structure, the cover structure defining, at least in part, a flat upper surface of the top-mount cable management structure, and together the base structure and the cover structure defining a substantially enclosed housing structure disposed over the at least one cable pass-through in the upper surface of the electronics rack; and
   wherein:
      the cover structure comprises a flexible element disposed to extend down to the at least one cable opening in the sidewall of the base structure to facilitate defining the substantially enclosed housing by blocking, at least in part, airflow through the at least one cable opening in the sidewall of the base structure; and
      the at least one cable opening in the sidewall of the base structure is sized to accommodate pass-through of multiple cables which extend through the at least one cable pass-through in the upper surface of the electronics rack, and wherein the flexible element is configured to reside within the at least one cable opening to contact and compress against, at least in part, the multiple cables.

11. The apparatus of claim 10, wherein the electronics rack has an air inlet side and an air outlet side, and wherein the base structure resides over the upper surface of the electronics rack at the air outlet side, and aligned in back of a vertically-extending, rear Electronic Industry Association (EIA) support rail within the electronics rack.

12. The apparatus of claim 10, wherein the base structure of the top-mount cable management structure has a width corresponding to a width of the electronics rack, and the enclosed housing defined by the base structure and cover structure facilitates achieving a UL-fire rated electronics enclosure notwithstanding the at least one cable pass-through in the upper surface of the electronics rack.

13. The apparatus of claim 10, wherein the top-mount cable management structure is reversible to allow the at least one cable opening in the sidewall of the base structure to face towards a front, air inlet side of the electronics rack or a rear, air outlet side of the electronics rack with the top-mount cable management structure operatively positioned over the upper surface of the electronics rack, and wherein the one or more cables pass-through the at least one cable opening in the sidewall of the base structure substantially parallel to the upper surface of the electronics rack.

14. The apparatus of claim 13, wherein the base structure is configured to be reversible in mounting to the upper surface of the electronics rack to allow reversing of a direction of the one or more cables exiting through the at least one cable opening in the sidewall of the base structure, and thus, through the top-mount cable management structure.

15. The apparatus of claim 13, wherein the sidewall of the base structure is a first sidewall and the at least one cable opening is at least one first cable opening, and wherein the base structure further comprises a second sidewall, the first sidewall and the second side wall being opposite sidewalls of the base structure, and wherein the top-mount cable management structure further comprises at least one second cable opening in the second sidewall of the base structure, the cover structure including a sidewall cover plate extending downward from a cover plate of the cover structure, the cover structure being reversible in mounting to the base structure, and when mounted to the base structure, the sidewall cover plate covers one of the at least one first cable opening in the first sidewall of the base structure or the at least one second cable opening in the second sidewall of the base structure, thereby providing the reversibility of the top-mount cable management structure.

16. The apparatus of claim 15, wherein the at least one first cable opening in the first sidewall of the base structure and the at least one second cable opening in the second sidewall of the base structure are similarly sized and configured.

17. The apparatus of claim 10, wherein the multiple cables pass through the at least one cable opening below the flexible element of the cover structure extending into the at least one cable opening.

18. A method of facilitating egress of cabling from an electronics rack, the method comprising: providing a top-mount cable management structure to reside over an upper surface of the electronics rack, over at least one cable pass-through in the upper surface of the electronics rack, the providing of the top-mount cable management structure including: providing a base structure to mount to the upper surface of the electronics rack, and reside over the at least one cable pass-through in the upper surface of the electronics rack, the base structure including a sidewall; providing at least one cable opening in the sidewall of the base structure to allow one or more cables which pass-through the at least one cable pass-through in the upper surface of the electronics rack to also pass-through the sidewall of the base structure; and providing a cover structure mounted to the base structure, the base structure and the cover structure together defining a substantially enclosed housing disposed over the at least one cable pass-through in the upper surface of the electronics rack when the top-mount cable management structure is operatively positioned over the upper surface of the electronics rack and the one or more cables pass-through the at least one cable opening in the sidewall of the base structure; wherein: the cover structure comprises a flexible element disposed to extend down to the at least one cable opening in the sidewall of the base structure to facilitate defining the substantially enclosed housing by blocking, at least in part, airflow through the at least one cable opening in the sidewall of the base structure: and the at least one cable opening in the sidewall of the base structure is sized to accommodate pass-through of multiple cables which extend through the at least one cable pass-through in the upper surface of the electronics rack, and wherein the flexible element is configured to reside within the at least one cable opening to contact and compress against, at least in part, the multiple cables.

\* \* \* \* \*